US012793929B2

(12) United States Patent
Takasaki et al.

(10) Patent No.: US 12,793,929 B2
(45) Date of Patent: Nov. 10, 2026

(54) CHARGED PARTICLE BEAM DEVICE

(71) Applicant: Hitachi High-Tech Corporation, Tokyo (JP)

(72) Inventors: Mihiro Takasaki, Tokyo (JP); Hirokazu Tamaki, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 362 days.

(21) Appl. No.: 18/705,611

(22) PCT Filed: Mar. 31, 2022

(86) PCT No.: PCT/JP2022/016592
§ 371 (c)(1),
(2) Date: Apr. 29, 2024

(87) PCT Pub. No.: WO2023/188294
PCT Pub. Date: Oct. 5, 2023

(65) Prior Publication Data

US 2024/0420915 A1 Dec. 19, 2024

(51) Int. Cl.
*H01J 37/28* (2006.01)
*H01J 37/147* (2006.01)
(Continued)

(52) U.S. Cl.
CPC .......... *H01J 37/153* (2013.01); *H01J 37/147* (2013.01); *H01J 37/265* (2013.01); *H01J 37/28* (2013.01);
(Continued)

(58) Field of Classification Search
CPC ........ H01J 37/28; H01J 37/265; H01J 37/147; H01J 37/153; H01J 2237/1532; H01J 2237/1534; H01J 2237/2802
See application file for complete search history.

(56) References Cited

U.S. PATENT DOCUMENTS 9,287,084 B2 * 3/2016 Cheng .................. H01J 37/153
2004/0004192 A1 1/2004 Krivanek et al.
(Continued)

FOREIGN PATENT DOCUMENTS

JP 2014-194982 A 10/2014
JP 5743698 B2 7/2015
JP 2021-082593 A 5/2021

OTHER PUBLICATIONS

International Search Report of PCT/JP2022/016592 dated Jun. 21, 2022.

*Primary Examiner* — Sean Luck
(74) *Attorney, Agent, or Firm* — MATTINGLY & MALUR, PC

(57) ABSTRACT

There is provided a charged particle beam device including an aberration corrector including a transmission lens disposed between a first multipole and a second multipole in order to correct five-fold fourth-order astigmatism (A4) while maintaining correction of four-fold third-order astigmatism (A3), and the charged particle beam device further includes: a first deflector configured to adjust an angle θ1 between a charged particle beam incident on the first multipole and an optical axis; a second deflector configured to adjust an angle θ2 between a charged particle beam incident on the second multipole and the optical axis; and a control unit configured to control the first deflector and the second deflector. The control unit changes the angle θ1 so as to correct the five-fold fourth-order astigmatism, and changes the angle θ2 so as to correct the four-fold third-order astigmatism that occurs due to a change in the angle θ1.

12 Claims, 7 Drawing Sheets

(51) Int. Cl.
*H01J 37/153* (2006.01)
*H01J 37/26* (2006.01)

(52) U.S. Cl.
CPC .................. *H01J 2237/1532* (2013.01); *H01J 2237/1534* (2013.01); *H01J 2237/2802* (2013.01)

(56) References Cited

U.S. PATENT DOCUMENTS

2008/0054186 A1* 3/2008 Hosokawa .......... H01J 37/1472
250/396 R
2021/0159044 A1 5/2021 Henstra et al.

* cited by examiner

[FIG. 1]
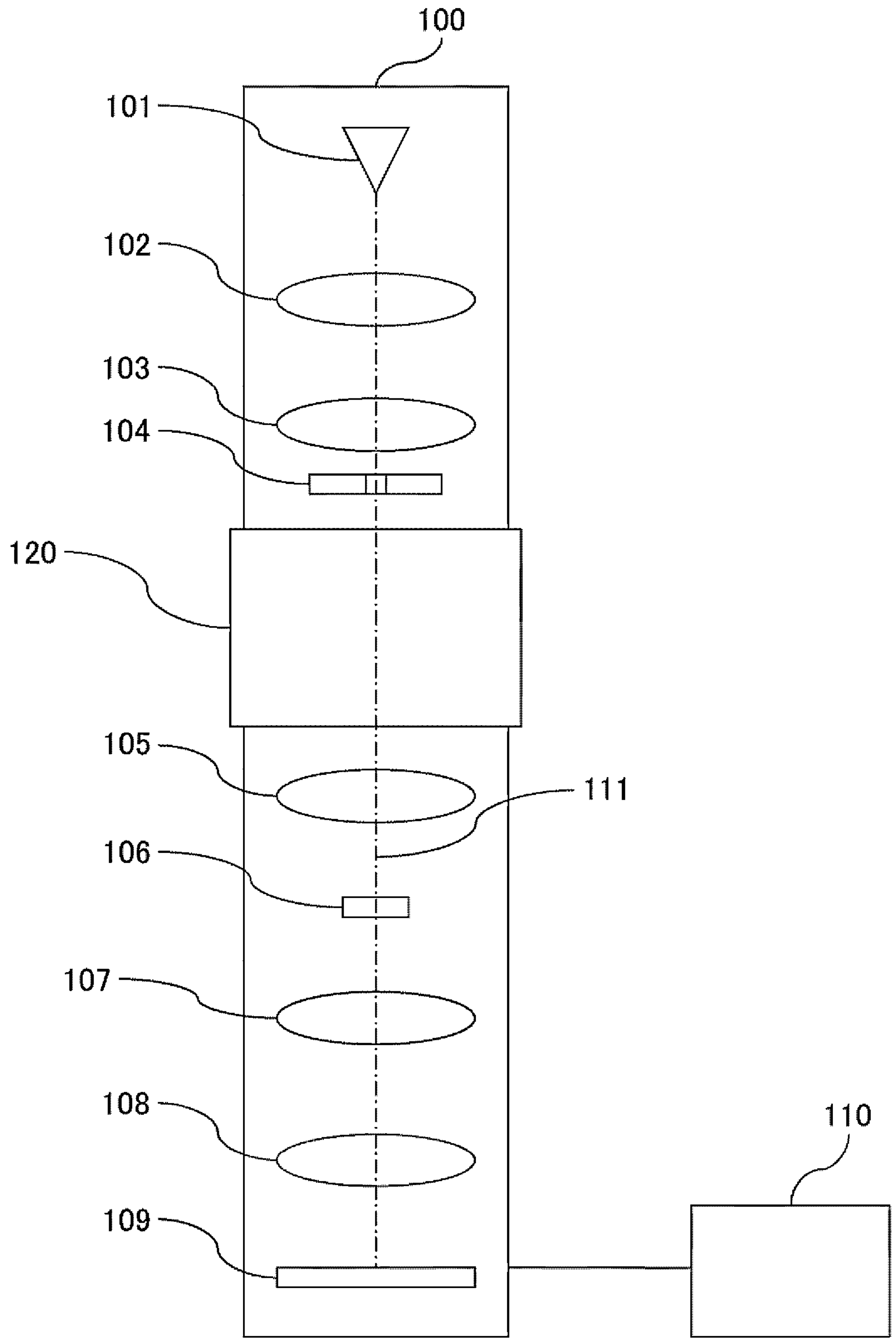

[FIG. 2A]
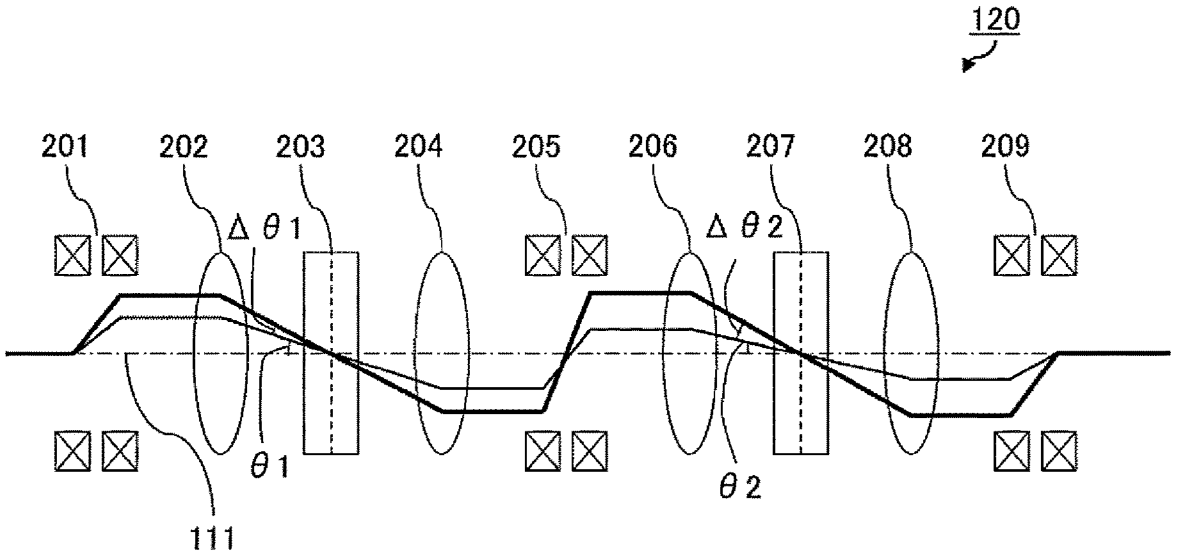
[FIG. 2B]
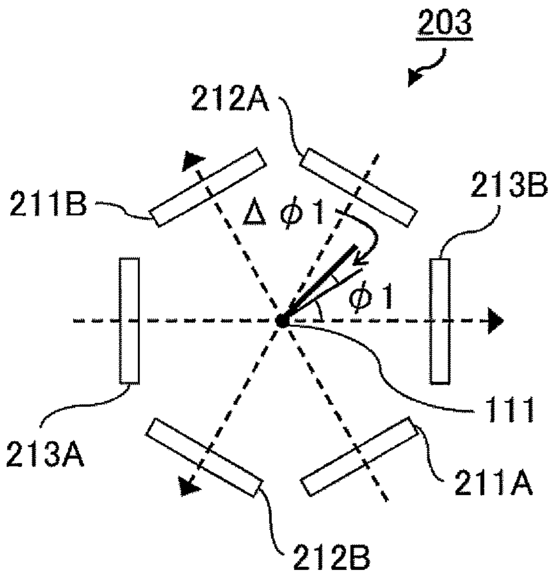

[FIG. 2C]
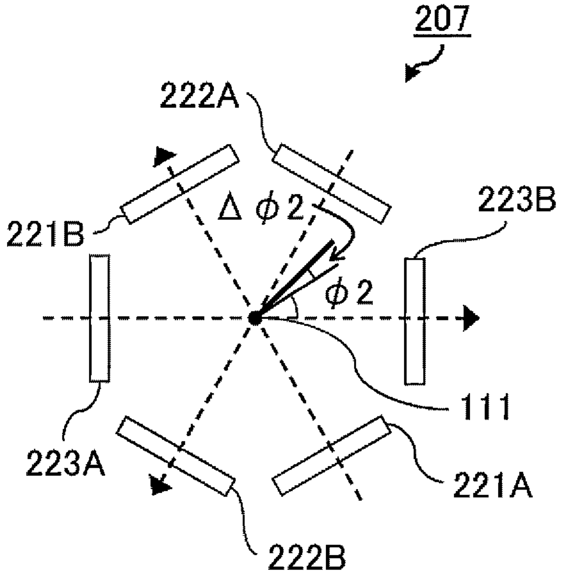

[FIG. 3]
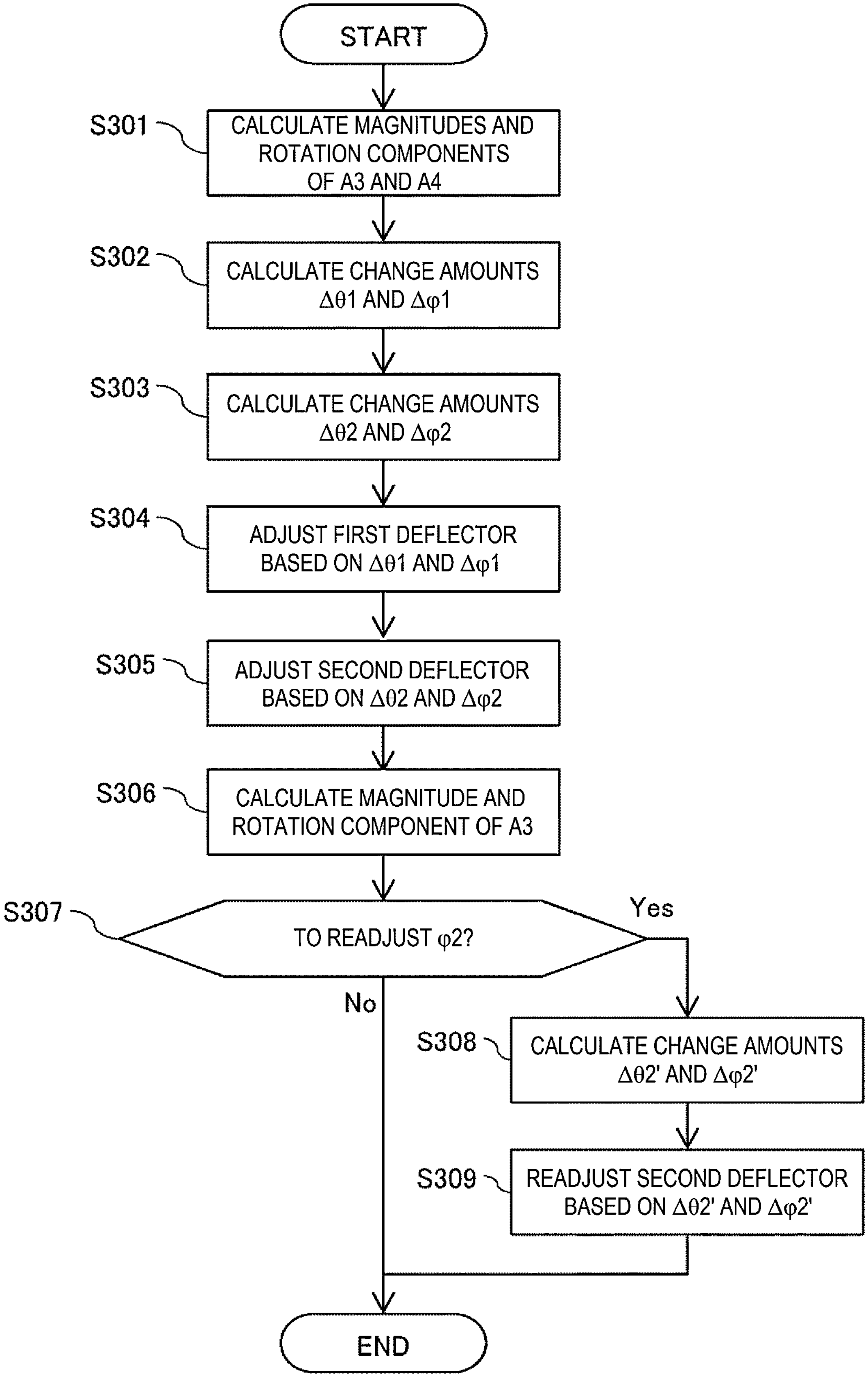

[FIG. 4]
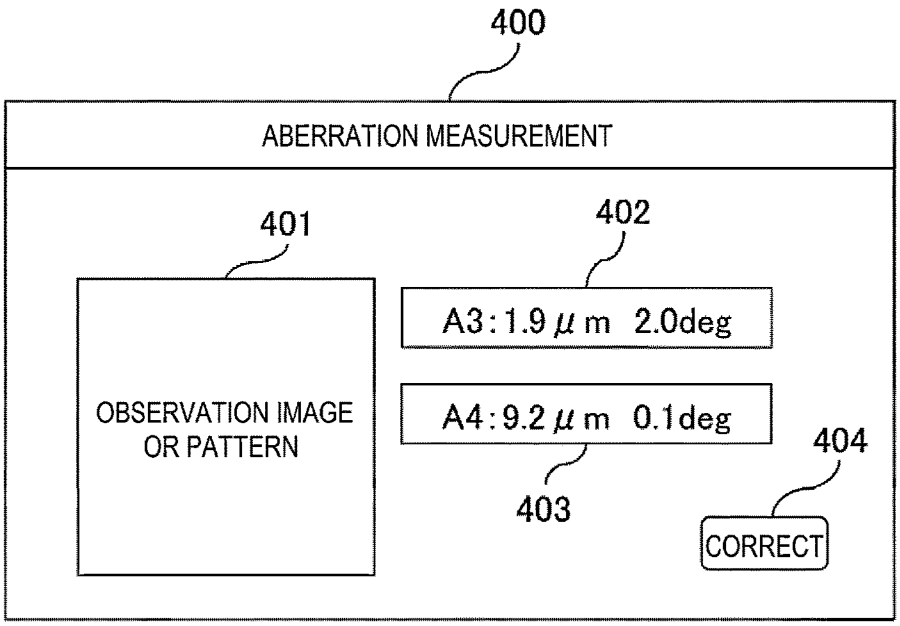
[FIG. 5]
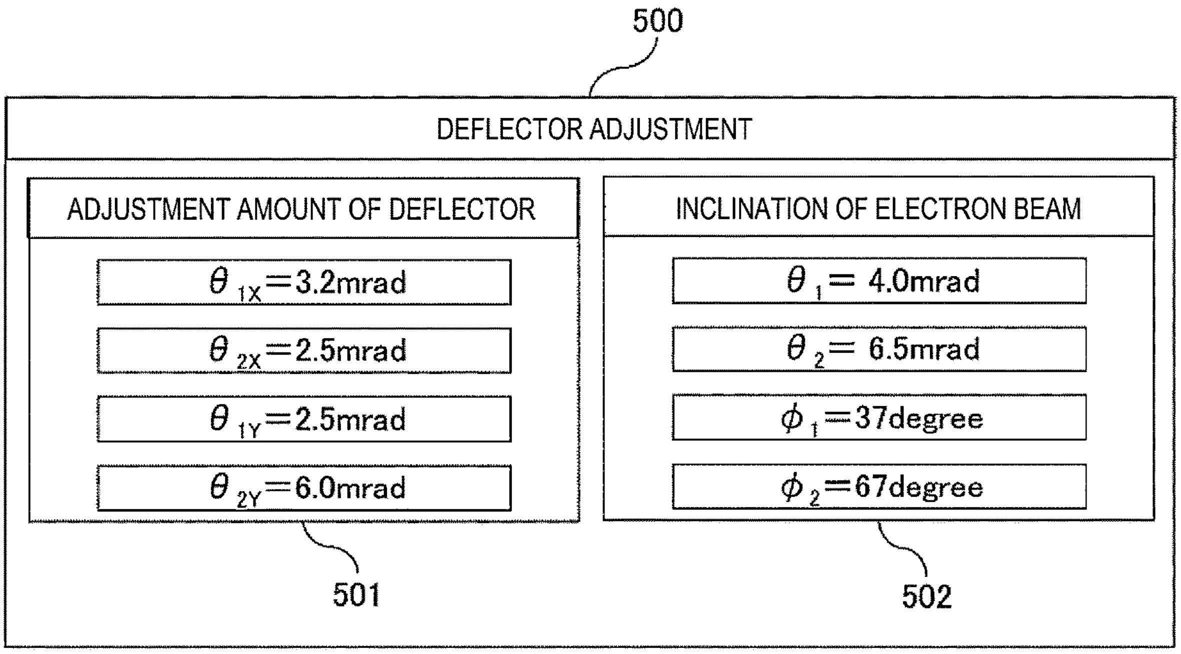

[FIG. 6A]
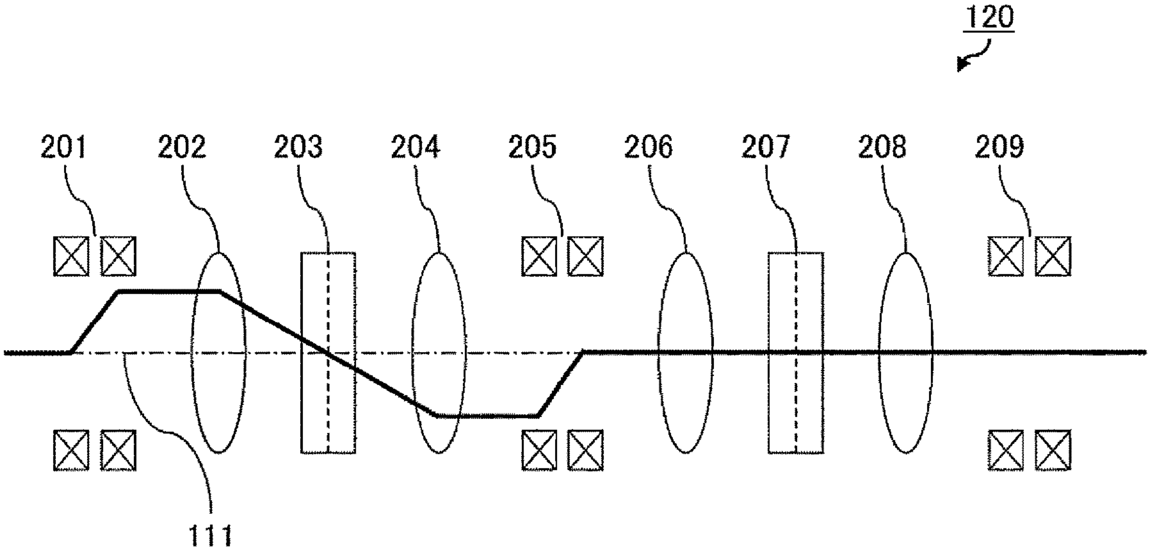
[FIG. 6B]
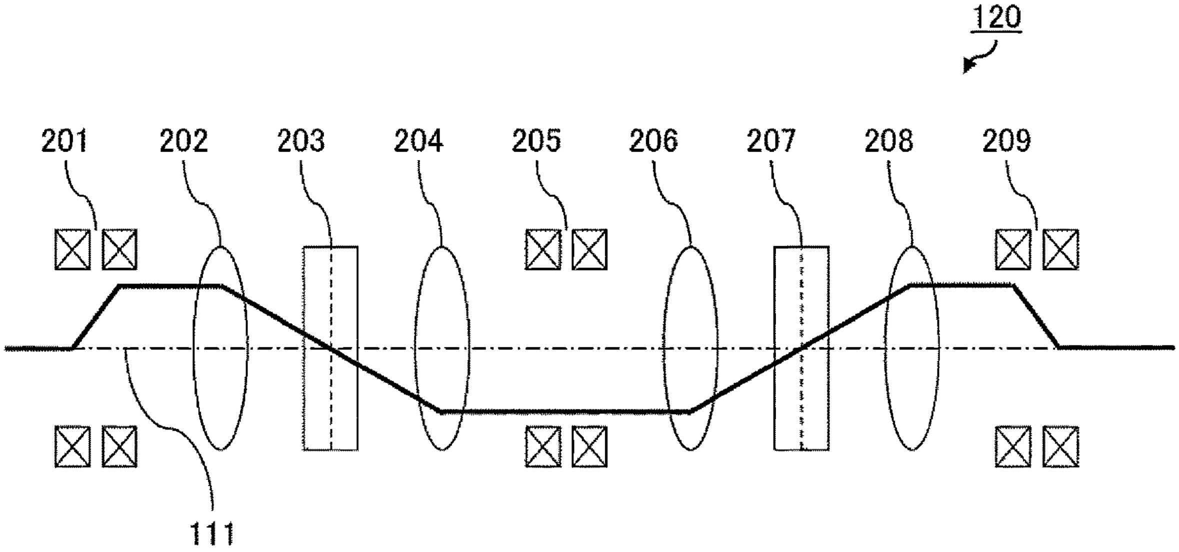

[FIG. 7]
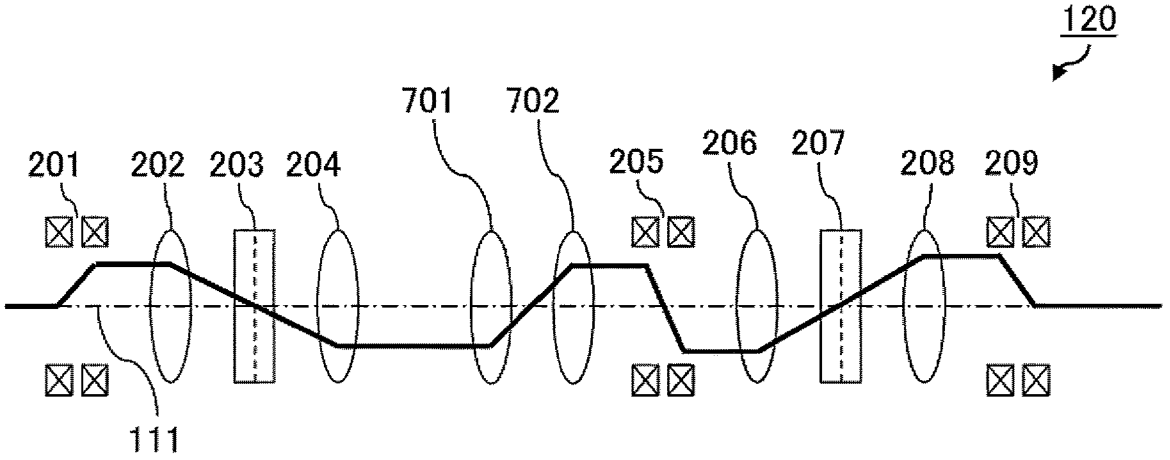
[FIG. 8]
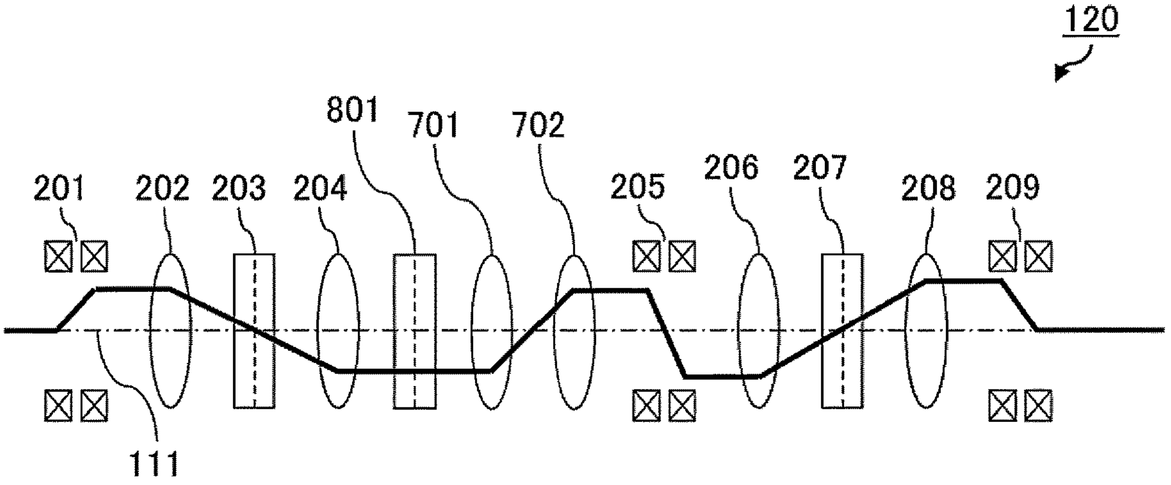

CHARGED PARTICLE BEAM DEVICE

TECHNICAL FIELD

The present invention relates to a charged particle beam device, and particularly to a technique for correcting astigmatism.

BACKGROUND ART

A charged particle beam device such as a transmission electron microscope, a scanning transmission electron microscope, or a scanning transmission electron microscope is a device that generates an observation image of a sample by irradiating the sample with a charged particle beam, and most of these include an aberration corrector that corrects spherical aberration that occurs in an objective lens. In an aberration corrector including two transmission lenses disposed between two multipoles, parasitic aberration occurs due to a positional deviation of the poles, a variation in characteristics of a pole material, and the like.

PTL 1 discloses an aberration corrector capable of independently correcting parasitic aberration of third or lower order, particularly two-fold third-order star aberration (S3) and four-fold third-order astigmatism (A3). Specifically, it is disclosed that one of S3 and A3 is corrected by controlling an angle θ1 between a charged particle beam incident on a first multipole and an optical axis, and the other is corrected by controlling an angle θ2 between a charged particle beam incident on a second multipole and the optical axis in conjunction with θ1. In order to prevent extra parasitic aberration from occurring at a subsequent stage of the aberration corrector, the charged particle beam emitted from the second multipole is swung back to the optical axis.

CITATION LIST

Patent Literature

PTL 1: JP5743698B

SUMMARY OF INVENTION

Technical Problem

However, in PTL 1, correction of the parasitic aberration of third or lower order is targeted, and correction of five-fold fourth-order astigmatism (A4) is not taken into consideration. In order to improve a resolution of an observation image generated by the charged particle beam device, it is necessary to correct A4 while maintaining the correction of A3.

Therefore, an object of the invention is to provide a charged particle beam device capable of correcting five-fold fourth-order astigmatism (A4) while maintaining correction of four-fold third-order astigmatism (A3).

Solution to Problem

In order to achieve the above object of the invention, there is provided a charged particle beam device including: an aberration corrector including a transmission lens disposed between a first multipole and a second multipole; a first deflector configured to adjust an angle θ1 between a charged particle beam incident on the first multipole and an optical axis; a second deflector configured to adjust an angle θ2 between a charged particle beam incident on the second multipole and the optical axis; and a control unit configured to control the first deflector and the second deflector. The control unit changes the angle θ1 so as to correct five-fold fourth-order astigmatism, and changes the angle θ2 so as to correct four-fold third-order astigmatism that occurs due to a change in the angle θ1.

Advantageous Effects of Invention

According to the invention, it is possible to provide a charged particle beam device capable of correcting five-fold fourth-order astigmatism (A4) while maintaining correction of four-fold third-order astigmatism (A3).

BRIEF DESCRIPTION OF DRAWINGS

FIG. 1 is a diagram showing an example of an overall configuration of a charged particle beam device according to Embodiment 1.

FIG. 2A is a diagram showing an example of a configuration of an aberration corrector according to Embodiment 1.

FIG. 2B is a diagram showing an example of a first multipole.

FIG. 2C is a diagram showing an example of a second multipole.

FIG. 3 is a diagram showing an example of a processing flow according to Embodiment 1.

FIG. 4 is a diagram showing an example of an aberration measurement screen.

FIG. 5 is a diagram showing an example of a deflector adjustment screen.

FIG. 6A is a diagram showing an example of an electron beam trajectory inclined with respect to an optical axis.

FIG. 6B is a diagram showing an example of the electron beam trajectory inclined with respect to the optical axis.

FIG. 7 is a diagram showing an example of a configuration of an aberration corrector according to Embodiment 2.

FIG. 8 is a diagram showing an example of a configuration of an aberration corrector according to Embodiment 3.

DESCRIPTION OF EMBODIMENTS

Hereinafter, charged particle beam devices according to embodiments of the invention will be described with reference to the accompanying drawings. In the following description and the accompanying drawings, components having the same functional configuration are denoted by the same reference numerals, and redundant description thereof will be omitted.

Embodiment 1

An example of an overall configuration of a scanning transmission electron microscope, which is one of charged particle beam devices, will be described with reference to FIG. 1. The scanning transmission electron microscope is a device that generates a transmission electron image by irradiating a sample with an electron beam and detecting transmission electrons transmitted through the sample, and includes a lens body 100 and a control unit 110.

The control unit 110 is a device that controls each unit provided in the lens body 100 and that generates an observation image based on a detection signal transmitted from the lens body 100, and is implemented by, for example, a computer.

The lens body 100 includes an electron source 101, focusing lenses 102 and 103, an aperture 104, an aberration corrector 120, a front objective lens 105, a rear objective lens 107, a projection lens 108, and a detector 109. Axes of the focusing lenses 102 and 103, the aperture 104, the aberration corrector 120, the front objective lens 105, the rear objective lens 107, the projection lens 108, and the detector 109 are aligned with an optical axis 111.

The electron source 101 emits an electron beam for irradiating a sample 106. The emitted electron beam is accelerated by a predetermined acceleration voltage, and then focused by focusing lenses 102 and 103 to pass through the aperture 104. The electron beam passed through the aperture 104 is corrected for aberration such as spherical aberration by the aberration corrector 120, and then focused onto a surface of the sample 106 by the front objective lens 105. The electron beam transmitted through the sample 106 is focused by the rear objective lens 107 and then projected onto the detector 109 by the projection lens 108. The detector 109 detects the projected electron beam and transmits a detection signal to the control unit 110.

An example of a configuration of the aberration corrector 120 will be described with reference to FIG. 2A. The aberration corrector 120 includes a first deflector 201, an adjustment lens 202, a first multipole 203, a transmission lens 204, a second deflector 205, a transmission lens 206, a second multipole 207, an adjustment lens 208, and a third deflector 209. The transmission lens 204 and the transmission lens 206 are disposed between the first multipole 203 and the second multipole 207. The first multipole 203 and the second multipole 207 have a conjugate relationship due to the transmission lens 204 and the transmission lens 206.

The first multipole 203 and the second multipole 207 each form a multipole field, which is a rotationally symmetric electric or magnetic field, in a region through which an electron beam passes. The first multipole 203 shown in FIG. 2B has six magnetic poles 211A to 213B, and forms a hexapole field, which is a three-fold field, by a flow of a magnetic flux between the magnetic poles. The second multipole 207 shown in FIG. 2C also has magnetic poles 221A to 223B, and forms a hexapole field similar to the first multipole 203. The first multipole 203 and the second multipole 207 are not limited to hexapole lenses having six magnetic poles, and may be dodecapole lenses having twelve magnetic poles. That is, the number of magnetic poles may be changed in order to control a direction of the formed hexapole field or to form another type of field.

The first deflector 201 is disposed closer to the electron source 101 than the first multipole 203 is, and adjusts an angle θ1 between the electron beam incident on the first multipole 203 and the optical axis 111, and an azimuth angle φ1 of the electron beam in a plane where a first multipole field is formed. The second deflector 205 is disposed between the transmission lens 204 and the transmission lens 206, and adjusts an angle θ2 between the electron beam incident on the second multipole 207 and the optical axis 111, and an azimuth angle φ2 of the electron beam in a plane where a second multipole field is formed. The third deflector 209 is disposed closer to the sample 106 than the second multipole 207 is, and swings the electron beam emitted from the second multipole 207 back to the optical axis 111.

As disclosed in PTL 1, an angle θ1 is controlled so as to correct one of two-fold third-order star aberration (S3) and four-fold third-order astigmatism (A3), and an angle θ2 is controlled in conjunction with the angle θ1 so as to correct the other. The electron beam emitted from the second multipole 207 is swung back to the optical axis 111, thereby preventing occurrence of extra parasitic aberration at a subsequent stage of the aberration corrector 120.

In order to improve a resolution of the observation image, it is necessary to correct five-fold fourth-order astigmatism (A4) in addition to S3 and A3. Therefore, A4 is corrected by changing the angle θ1 between the electron beam incident on the first multipole 203 and the optical axis 111 by the first deflector 201, that is, by adding a change amount Δθ1 to the angle θ1. The change amount Δθ1 is obtained, for example, by the following equation.

$$\Delta\theta 1 = A/(B1 \cdot C1) \quad \text{(Equation 1A)}$$

Here, A is a magnitude of the five-fold fourth-order astigmatism (A4), and is calculated based on, for example, an observation image or a pattern. The pattern used to calculate the aberration is, for example, a projection pattern such as a Ronchigram. B1 is an intensity of the multipole field formed by the first multipole 203. C1 is an adjustment coefficient of the first deflector 201, and is a constant determined by a position of each lens or multipole.

Further, in order to correct A4, it is preferable to perform adjustment corresponding to a rotation component based on a measured phase of A4. A change amount Δφ1 in the azimuth angle φ1 of the electron beam in the plane where the first multipole field is formed is obtained, for example, by the following equation.

$$\Delta\varphi 1 = D + E1 \quad \text{(Equation 1B)}$$

Here, D is a rotation component of the five-fold fourth-order astigmatism (A4), and is calculated based on, for example, an observation image or a pattern. E1 is an adjustment coefficient of the first deflector 201, and is a constant determined by a position of each lens or multipole.

By adding the change amount Δθ1 to the angle θ1, the four-fold third-order astigmatism (A3) occurs. Therefore, A3 that occurs due to the change amount 66 θ1 is corrected by changing the angle θ2 between the electron beam incident on the second multipole 207 and the optical axis 111 by the second deflector 205, that is, by adding a change amount 66 θ2 to the angle θ2. The change amount 66 θ2 is obtained, for example, by the following equation.

$$\Delta\theta 2 = (A3\_1/A3\_2) \cdot \Delta\theta 1 \quad \text{(Equation 2)}$$

Here, A3_1 is a magnitude of the four-fold third-order astigmatism (A3) in the first multipole 203, and A3_2 is a magnitude of the four-fold third-order astigmatism (A3) in the second multipole 207. In FIG. 2A, a trajectory of the electron beam before correction of A4 is indicated by a thin line, and a trajectory of the electron beam after the correction of A4 is indicated by a thick line.

When the azimuth angle φ1 of the electron beam in the plane where the first multipole 203 forms the multipole field changes in a plane orthogonal to the optical axis 111 shown in FIG. 2B, it is desirable to equally change the azimuth angle φ2 of the electron beam in the plane where the second multipole 207 forms the multipole field. That is, an absolute value of a difference between the change amount Δφ1 in the azimuth angle φ1 and the change amount Δφ2 in the azimuth angle φ2 is preferably 90 degrees or less, and more preferably 0 degrees. The change amount $\Delta\varphi 1$ is adjusted by the first deflector 201, and the change amount $\Delta\varphi 2$ is adjusted by the second deflector 205.

When a rotation component is generated in the four-fold third-order astigmatism (A3) in the plane orthogonal to the optical axis 111 due to the change amount $\Delta\theta 1$, it is desirable to adjust the change amount $\Delta\varphi 2$ such that a rotation component $\varphi A3\_1$ at the first multipole 203 and a rotation component $\varphi A3\_2$ at the second multipole 207 cancel each other. The change amount $\Delta\varphi 2$ is obtained, for example, by the following equation.

$$\Delta\varphi 2 = \varphi A3\_1 + \varphi A3\_2 - \Delta\varphi 1 + \pi \quad \text{(Equation 3)}$$

An example of a processing flow according to Embodiment 1 will be described for each step with reference to FIG. 3.

(S301)

The control unit 110 calculates magnitudes and rotation components of the four-fold third-order astigmatism (A3) and the five-fold fourth-order astigmatism (A4). The magnitude and the rotation component of the aberration are calculated based on, for example, an observation image or a pattern. The calculated magnitude and rotation component of the aberration may be displayed on a screen as shown in FIG. 4. An aberration measurement screen 400 shown in FIG. 4 includes an observation image display portion 401, an A3 display portion 402, an A4 display portion 403, and a correction button 404. The observation image or the pattern used for aberration measurement is displayed on the observation image display portion 401. A measurement result of the four-fold third-order astigmatism (A3) is displayed on the A3 display portion 402. A measurement result of the five-fold fourth-order astigmatism (A4) is displayed on the A4 display portion 403. The correction button 404 is a button to be pressed when starting aberration correction.

(S302)

The control unit 110 calculates the change amount $\Delta\theta 1$ in the angle $\theta 1$ and the change amount $\Delta\varphi 1$ in the azimuth angle $\varphi 1$ based on the magnitude and the rotation component of A4 calculated in S301. The change amounts $\Delta\theta 1$ and $\alpha\varphi 1$ are calculated using, for example, (Equation 1A) and (Equation 1B).

(S303)

The control unit 110 calculates the change amount $\Delta\theta 2$ in the angle $\theta 2$ and the change amount $\Delta\varphi 2$ in the azimuth angle $\varphi 2$ based on the change amount $\Delta\theta 1$ calculated in S302. The change amount $\Delta\theta 2$ and the change amount $\Delta\varphi 2$ are calculated using, for example, (Equation 2) and (Equation 3). A3_1 and A3_2 are calculated in advance based on, for example, an observation image or a pattern.

(S304)

The control unit 110 controls the first deflector 201 based on the change amount $\Delta\theta 1$ calculated in S302 to correct the five-fold fourth-order astigmatism (A4).

(S305)

The control unit 110 controls the second deflector 205 based on the change amount $\Delta\theta 2$ calculated in S303 to correct the five-fold fourth-order astigmatism (A4).

(S306)

The control unit 110 calculates the magnitude and the rotation component of the four-fold third-order astigmatism (A3). The magnitude and the rotation component of the aberration are calculated based on, for example, an observation image or a pattern. The calculated magnitude and rotation component of the aberration may be displayed on the screen as shown in FIG. 4. The screen displayed in S301 may be updated, or a screen different from the screen displayed in S301 may be displayed.

(S307)

The control unit 110 determines whether to readjust the angle $\theta 2$ between the electron beam incident on the second multipole 207 and the optical axis 111 and the azimuth angle $\varphi 2$ of the electron beam in the plane where the second multipole 207 forms the multipole field. For example, if a difference between the A3 aberration calculated in S301 and the A3 aberration calculated in S306 is equal to or greater than a predetermined amount, it is determined that readjustment is to be performed. When the azimuth angle $\varphi 2$ is not to be readjusted, the processing flow ends, and when the azimuth angle $\varphi 2$ is to be readjusted, the processing proceeds to S308. In S308, a new change amount for controlling the second deflector 205 is calculated such that A3_1 and A3_2 cancel each other.

(S308)

The control unit 110 calculates a new change amount $\Delta\theta 2'$ and a new change amount $\Delta\varphi 2'$ for controlling the second deflector 205 based on the difference between the four-fold third-order astigmatism (A3) calculated in S301 and A3 calculated in S306. The change amount $\Delta\theta 2'$ and the change amount $\Delta\varphi 2'$ are calculated using, for example, (Equation 2) and (Equation 3).

(S309)

The control unit 110 readjusts the second deflector 205 based on the new change amount $\Delta\theta 2'$ and the new change amount $\Delta\varphi 2'$ calculated in S308, and corrects the four-fold third-order astigmatism (A3) that occurs due to the change amounts $\Delta\theta 1$ and $\Delta\varphi 1$.

According to the processing flow described with reference to FIG. 3, it is possible to correct the five-fold fourth-order astigmatism (A4) while maintaining correction of the four-fold third-order astigmatism (A3). An angle of the electron beam and an adjustment amount of the deflector obtained in the process of the processing flow may be displayed on a screen as shown in FIG. 5. A deflector adjustment screen 500 shown in FIG. 5 includes an adjustment amount display portion 501 and an inclination display portion 502. The adjustment amount display portion 501 displays adjustment amounts of the first deflector 201 and the second deflector 205 during the aberration correction. The inclination display portion 502 displays an inclination of the electron beam adjusted by the aberration correction. The adjustment amount of the deflector shown here can also be substituted by a current value or a control value during internal control of the deflector, and can also be substituted by a magnitude of the adjustment amount and a notation using a rotation component without being divided into X and Y components.

The trajectory of the electron beam at the aberration corrector 120 is not limited to that shown in FIG. 2A, and may be a trajectory of the electron beam shown in FIG. 6A or 6B. FIG. 6A shows a trajectory in which the electron beam incident on the first multipole 203 is inclined with respect to the optical axis 111 by the first deflector 201, and then the electron beam incident on the second multipole 207 is swung back to the optical axis 111 by the second deflector 205. Since the electron beam incident on the second multipole 207 is swung back to the optical axis 111, the change amount $\Delta\theta 1$ at the first multipole 203 does not affect the trajectory of the electron beam at the second multipole 207. FIG. 6B shows a trajectory in which the electron beam incident on the first multipole 203 is only inclined with respect to the optical axis 111 by the first deflector 201.

Embodiment 2

The aberration corrector 120 in which a set of the transmission lens 204 and the transmission lens 206 is disposed between the first multipole 203 and the second multipole 207 has been described in Embodiment 1. The aberration corrector 120 in which one more set of transmission lenses is provided will be described in Embodiment 2. In Embodiment 2, a part of configurations and functions described in Embodiment 1 can be applied, and thus the same configurations and functions are denoted by the same reference numerals and description thereof will be omitted.

An example of a configuration of the aberration corrector 120 according to Embodiment 2 will be described with reference to FIG. 7. Since the aberration corrector 120 shown in FIG. 7 is obtained by adding a set of a transmission lens 701 and a transmission lens 702 to the aberration corrector 120 shown in FIG. 2A, description of components other than the transmission lens 701 and the transmission lens 702 will be omitted.

The transmission lens 701 and the transmission lens 702 are disposed between the transmission lens 204 and the second deflector 205. By adding the transmission lens 701 and the transmission lens 702, the angle θ2 of the electron beam incident on the second multipole 207 is inverted with respect to the case in FIG. 2A, and similarly, the aberration is also inverted, but A4 can be corrected while maintaining correction of A3 by the same processing flow as in Embodiment 1. Even when the transmission lens is further added, A4 can be corrected while maintaining the correction of A3 by the same processing flow as in Embodiment 1.

Embodiment 3

The aberration corrector 120 including the first multipole 203 and the second multipole 207 has been described in Embodiment 1 and Embodiment 2. The aberration corrector 120 to which a third multipole is further added will be described in Embodiment 3. In Embodiment 3, a part of the configurations and functions described in Embodiments 1 and 2 can be applied, and thus the same configurations and functions are denoted by the same reference numerals and description thereof will be omitted.

An example of a configuration of the aberration corrector 120 according to Embodiment 3 will be described with reference to FIG. 8. Since the aberration corrector 120 shown in FIG. 8 is obtained by adding a third multipole 801 to the aberration corrector 120 shown in FIG. 7, description of components other than the third multipole 801 will be omitted.

The third multipole 801 is disposed between the transmission lens 204 and the transmission lens 701. By adding the third multipole 801, the change amount Δθ1 and the change amount Δθ2 need to be adjusted such that A3 that occurs due to a trajectory change of the electron beam at each of the three multipoles cancels one another. However, since the trajectory change of the electron beam at the third multipole 801 is affected by the trajectory change of the electron beam at the first multipole 203, A3 related to the first multipole 203 and A3 related to the third multipole 801 may be cancelled by A3 related to the second multipole 207. That is, A3 that occurs due to adjustment of the first deflector 201 can be corrected by adjustment of the second deflector 205. Even when the transmission lens or the multipole is further added, A4 can be corrected while maintaining correction of A3 by the same processing flow as in Embodiment 1.

The charged particle beam devices according to three embodiments of the invention have been described above. The charged particle beam device according to the invention is not limited to the above embodiments, and can be embodied by modifying components without departing from the gist of the invention. A plurality of components disclosed in the above embodiments may be combined appropriately. Further, some components may be deleted from all the components shown in the above embodiments.

REFERENCE SIGNS LIST

100: lens body
101: electron source
102: focusing lens
103: focusing lens
104: aperture
105: front objective lens
106: sample
107: rear objective lens
108: projection lens
109: detector
110: control unit
111: optical axis
120: aberration corrector
201: first deflector
202: adjustment lens
203: first multipole
204: transmission lens
205: second deflector
206: transmission lens
207: second multipole
208: adjustment lens
209: third deflector
211A: magnetic pole
211B: magnetic pole
212A: magnetic pole
212B: magnetic pole
213A: magnetic pole
213B: magnetic pole
221A: magnetic pole
221B: magnetic pole
222A: magnetic pole
222B: magnetic pole
223A: magnetic pole
223B: magnetic pole
400: aberration measurement screen
401: observation image display portion
402: A3 display portion
403: A4 display portion
404: correction button
500: deflector adjustment screen
501: adjustment amount display portion
502: inclination display portion
701: transmission lens
702: transmission lens
801: third multipole

The invention claimed is:

1. A charged particle beam device comprising:

an aberration corrector including a transmission lens disposed between a first multipole and a second multipole;

a first deflector configured to adjust an angle θ1 between a charged particle beam incident on the first multipole and an optical axis;

a second deflector configured to adjust an angle θ2 between a charged particle beam incident on the second multipole and the optical axis; and a control unit configured to control the first deflector and the second deflector, wherein the control unit changes the angle θ1 so as to correct five-fold fourth-order astigmatism, and changes the angle θ2 so as to correct four-fold third-order astigmatism that occurs due to a change in the angle θ1.

2. The charged particle beam device according to claim 1, wherein the control unit calculates a change amount in the angle θ1 based on a magnitude of the five-fold fourth-order astigmatism calculated based on an observation image or a pattern and an intensity of a first multipole field formed by the first multipole.

3. The charged particle beam device according to claim 2, wherein the control unit calculates a change amount Δθ1 in the angle θ1 using $\Delta\theta 1 = A/(B1 \cdot C1)$, in which A is the magnitude of the five-fold fourth-order astigmatism, B1 is the intensity of the first multipole field, and C1 is an adjustment coefficient of the first deflector.

4. The charged particle beam device according to claim 1, wherein based on a rotation component of the five-fold fourth-order astigmatism calculated based on an observation image or a pattern, and a direction of a first multipole field formed by the first multipole, the control unit calculates a change amount in an azimuth angle φ1 of the charged particle beam in a plane where the first multipole field is formed.

5. The charged particle beam device according to claim 1, wherein based on, in a plane orthogonal to the optical axis of the first multipole, a change amount Δφ1 in an azimuth angle φ1 of the charged particle beam in a plane where the first multipole forms a first multipole field, the control unit adjusts, in a plane orthogonal to the optical axis of the second multipole, a change amount Δφ2 in an azimuth angle φ2 of the charged particle beam in a plane where the second multipole forms a second multipole field.

6. The charged particle beam device according to claim 5, wherein the control unit controls the first deflector and the second deflector such that an absolute value of a difference between the change amount Δφ1 and the change amount Δφ2 is 90 degrees or less.

7. The charged particle beam device according to claim 6, wherein the control unit controls the first deflector and the second deflector such that the change amount Δφ1 and the change amount Δφ2 coincide with each other.

8. The charged particle beam device according to claim 5, wherein the control unit calculates the change amount Δφ2 using $\Delta\varphi 2 = \varphi A3\_1 + \varphi A3\_2 - \Delta\varphi 1 + \pi$, in which a rotation component is generated in the four-fold third-order astigmatism in the plane orthogonal to the optical axis due to the change amount Δφ1, φA3_1 is the rotation component at the first multipole, and φA3_2 is the rotation component at the second multipole.

9. The charged particle beam device according to claim 1, wherein the control unit calculates the five-fold fourth-order astigmatism or the four-fold third-order astigmatism based on an observation image or a pattern and displays the five-fold fourth-order astigmatism or the four-fold third-order astigmatism on a screen.

10. The charged particle beam device according to claim 9, wherein the control unit further displays the observation image or the pattern on the screen.

11. The charged particle beam device according to claim 1, wherein the control unit displays an adjustment amount of the first deflector and an adjustment amount of the second deflector on a screen.

12. The charged particle beam device according to claim 1, wherein when correcting the five-fold fourth-order astigmatism, at least one aberration or more of two-fold first-order astigmatism, one-fold second-order coma aberration, three-fold second-order astigmatism, and two-fold third-order star aberration is corrected.

* * * * *